US008492175B1

(12) United States Patent
Fanfelle

(10) Patent No.: US 8,492,175 B1
(45) Date of Patent: Jul. 23, 2013

(54) SYSTEM AND METHOD FOR ALIGNING SURFACE MOUNT DEVICES ON A SUBSTRATE

(75) Inventor: Robert James Fanfelle, Woodside, CA (US)

(73) Assignees: Applied Micro Circuits Corporation, San Diego, CA (US); Volex PLC, London (GB)

( * ) Notice: Subject to any disclaimer, the term of this patent is extended or adjusted under 35 U.S.C. 154(b) by 64 days.

(21) Appl. No.: 13/305,471

(22) Filed: Nov. 28, 2011

(51) Int. Cl.
*G01R 31/26* (2006.01)

(52) U.S. Cl.
USPC ...... 438/15; 438/109; 438/401; 257/E21.525; 257/E21.53

(58) Field of Classification Search
None
See application file for complete search history.

(56) References Cited

U.S. PATENT DOCUMENTS

| | | | | |
|---|---|---|---|---|
| 4,999,311 | A * | 3/1991 | Dzarnoski et al. | 438/109 |
| 6,190,997 | B1 * | 2/2001 | Becker et al. | 438/401 |
| 6,420,195 | B1 * | 7/2002 | King et al. | 438/14 |
| 6,682,946 | B2 * | 1/2004 | King et al. | 438/14 |
| 2002/0134577 | A1 | 9/2002 | Watanabe | |
| 2003/0223214 | A1 | 12/2003 | Hayashi | |
| 2005/0064612 | A1 * | 3/2005 | Ishizu et al. | 438/15 |
| 2007/0164082 | A1 | 7/2007 | Suehiro | |
| 2007/0164083 | A1 | 7/2007 | Suehiro | |
| 2009/0056111 | A1 | 3/2009 | Muren | |
| 2009/0284939 | A1 | 11/2009 | Suehiro | |
| 2009/0284940 | A1 | 11/2009 | Suehiro | |
| 2009/0315189 | A1 * | 12/2009 | Sasaki et al. | 257/777 |
| 2009/0321957 | A1 * | 12/2009 | Sasaki et al. | 257/777 |
| 2009/0325345 | A1 * | 12/2009 | Sasaki et al. | 438/109 |
| 2010/0044879 | A1 * | 2/2010 | Sasaki et al. | 257/777 |
| 2010/0200977 | A1 * | 8/2010 | Sasaki et al. | 257/690 |
| 2010/0304531 | A1 * | 12/2010 | Sasaki et al. | 438/109 |
| 2010/0327464 | A1 * | 12/2010 | Sasaki et al. | 257/777 |
| 2011/0223695 | A1 * | 9/2011 | Chen | 438/15 |

* cited by examiner

*Primary Examiner* — David E Graybill
(74) *Attorney, Agent, or Firm* — Woodcock Washburn LLP

(57) ABSTRACT

A method is provided for assembling a stack of surface-mount devices (SMDs) on a substrate. The method provides a substrate, die, or printed circuit board (PCB) with a top surface having a landing pad and a first reference feature. An alignment jig is placed overlying the substrate top surface. The alignment jig second reference feature is aligned with respect to the substrate first reference feature. A first SMD is placed overlying the substrate landing pad. The first SMD third reference feature is aligned with respect to the alignment jig second reference feature. A second SMD is placed overlying the substrate top surface. Then, the alignment jig first boundary feature is mated with the second SMD second boundary feature. In response to the mating, the second SMD first interface is aligned over an underlying SMD active element.

17 Claims, 7 Drawing Sheets

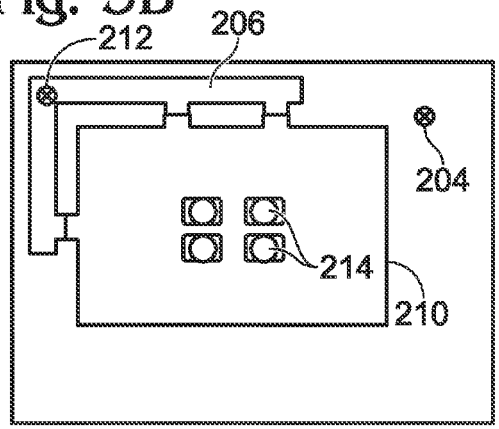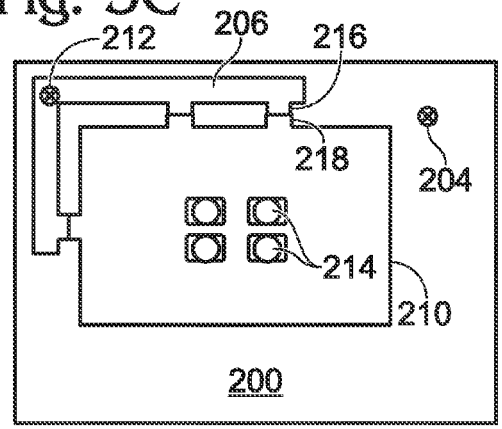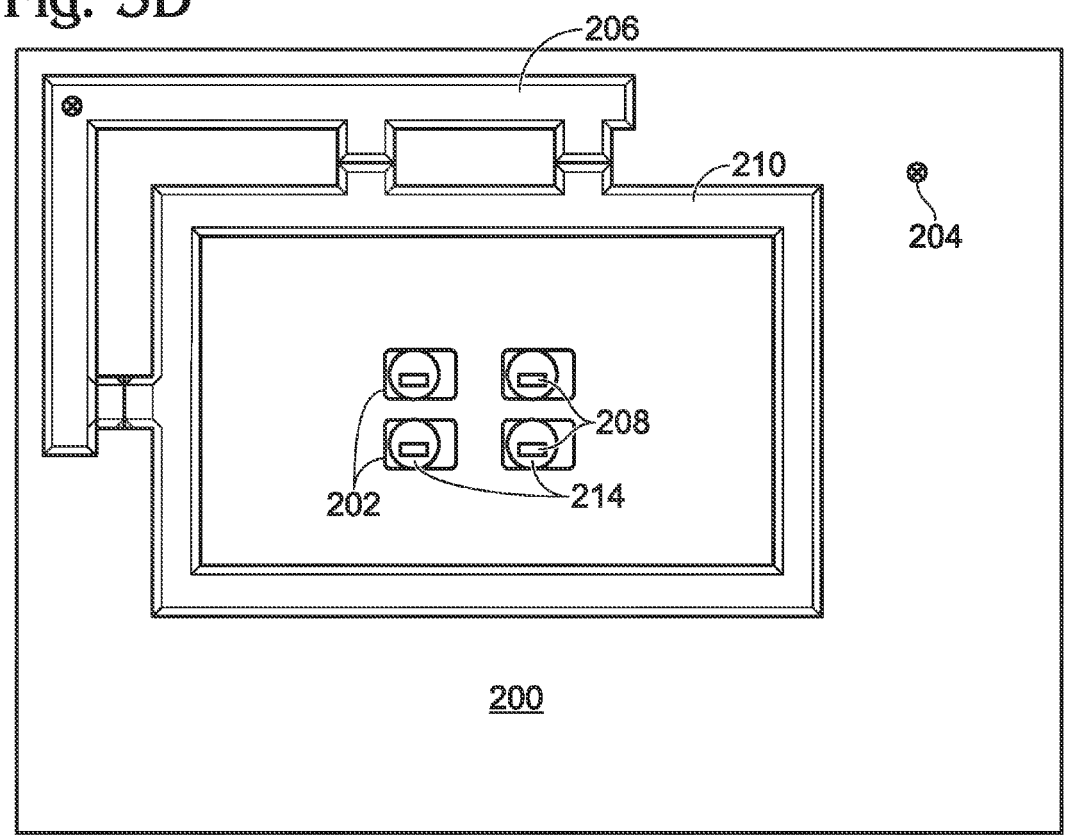

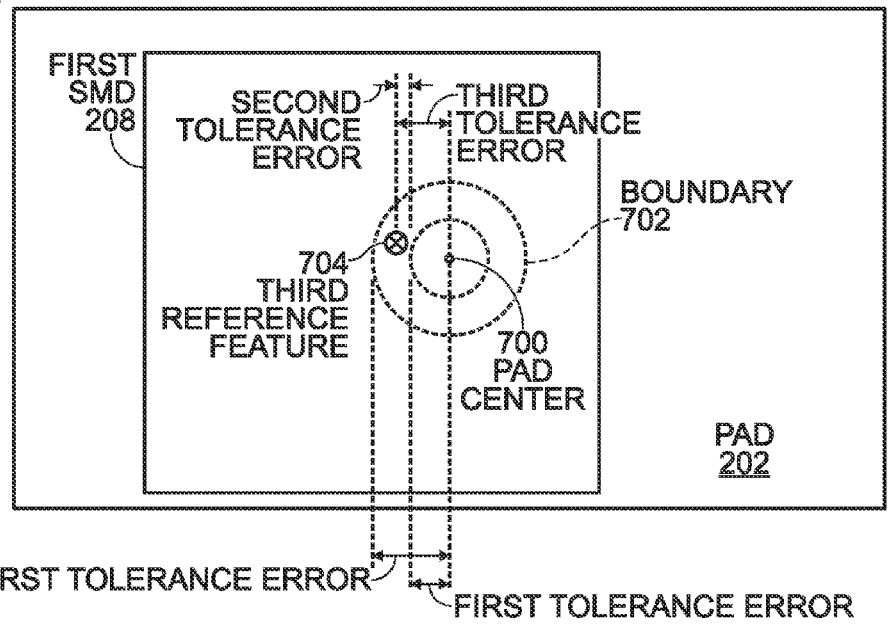
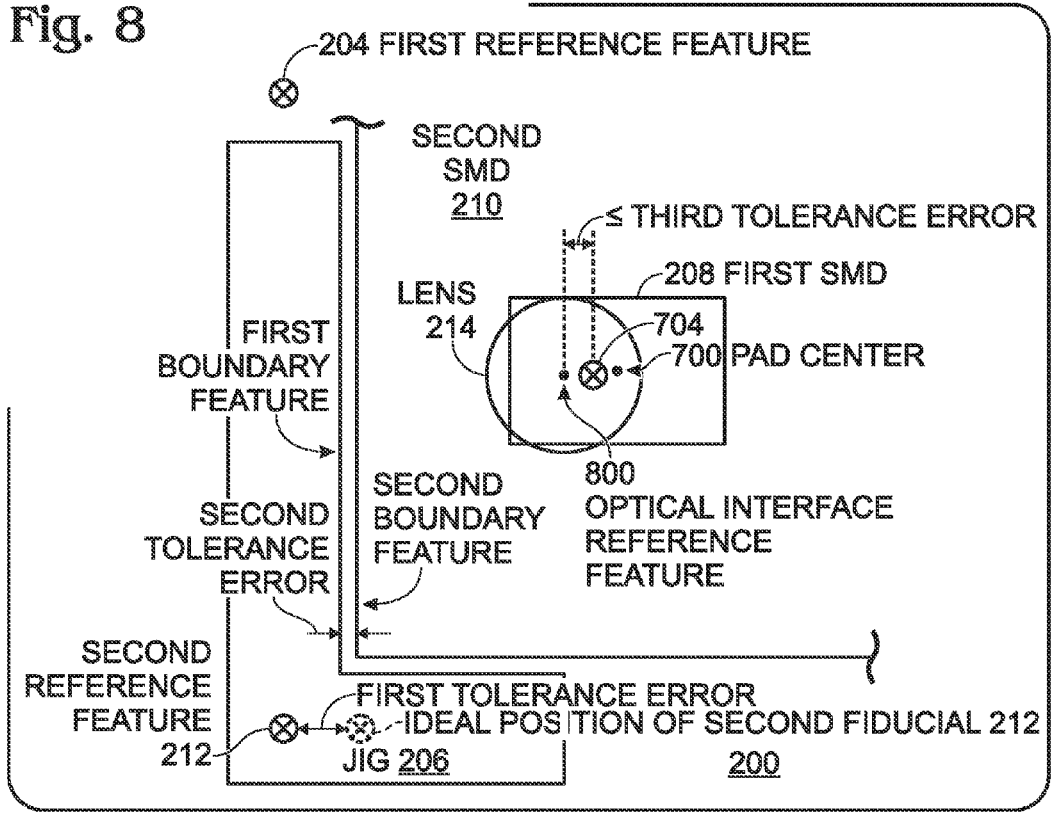

SYSTEM AND METHOD FOR ALIGNING SURFACE MOUNT DEVICES ON A SUBSTRATE

BACKGROUND OF THE INVENTION

1. Field of the Invention

This invention generally relates to integrated circuit packaging and, more particularly, to a system and method for precisely aligning a stack of tightly tolerance surface mount devices such as optical components.

2. Description of the Related Art

As noted in Wikipedia, common commercial circuit packaging includes the dual in-line package (DIP), pin, grid array (PGA), ball grid array (BGA), leadless chip carrier (LCC) packages, and surface mount package with leads formed as either a gull-wing or J-lead. A surface mount package typically occupies an area about 30-50% less than an equivalent DIP, with a typical thickness that is 70% less. This package has "gull wing" leads protruding from the two long sides and a lead spacing of 0.050 inches. In a Flip-chip Ball Grid Array (FCBGA) package the die is mounted upside-down (flipped) and connects to the package balls via a package substrate that is similar to a printed-circuit board rather than by wires. When multiple dies are combined on a small substrate, it's called an MCM, or Multi-Chip Module. A big MCM may be considered to be a small printed circuit board (PCB).

Individual components or surface mount devices (SMDs) may be placed on a die or printed circuit board (PCB) using a SMT (surface mount technology) component placement system, commonly called a pick-and-place machine. Generally, these robotic machines are used to place surface-mount devices (SMDs) onto a PCB. They are used for high speed, relatively high precision placing of broad range of electronic components, like capacitors, resistors, integrated circuits onto PCBs. These systems normally use pneumatic suction nozzles, attached to a plotter-like device to allow the nozzle head to be accurately manipulated in three dimensions. Additionally, each nozzle can be rotated independently.

Surface mount components are placed along the front (and often back) faces of the machine. Most components are supplied on paper or plastic tape, the tape reels are loaded onto feeders mounted to the machine. Through the middle of the machine there is a conveyor belt, along which blank PCBs travel. The PCB is clamped, and the nozzles pick up individual components from the feeders/trays, rotate them to the correct orientation and then place them on the appropriate pads on the PCB.

As the part is carried from the part feeders on either side of the conveyor belt to the PCB, it is photographed from below. Its silhouette is inspected and the inevitable registration errors in pickup are measured and compensated for when the part is placed. For example, if the part was shifted 0.25 mm and rotated 10° when picked up, the pickup head will adjust the placement position to place the part in the correct location.

A separate camera on the pick-and-place head photographs fiducial marks on the PCB to measure its position on the conveyor belt accurately. Two fiducial marks, measured in two dimensions each, permit the PCB's orientation and thermal expansion to be measured and compensated for as well. The components may be temporarily adhered to the PCB using the wet solder paste itself, or by using small blobs of a separate adhesive applied by a glue dispensing machine.

Some conventional tolerances are as follows. For adhesive and solder process equipment, the dimensions of the components and their tolerances are typically +/−0.1-0.2 mm. Dimension tolerances for a PCB are 0.05-0.15 mm. Conductor line widths and tolerances are 0.1-0.2 mm. High throughput pick-and-place equipment typically provides placement tolerances of 0.05-0.2 mm. Highly accurate pick-and-place equipment can provide tolerances down to 0.001 mm, but the equipment purchase price, maintenance requirements, and low throughput make their use prohibitively expensive for most commercial applications.

Unfortunately, high throughput pick-and-place machines do not currently have the placement accuracy to locate parts that must be stacked on top of each other with tight tolerances, such as optical system components. The bottom component is placed within the bounds of the inherent planar tolerance error (X) and rotational tolerance error (R) of the placement system with respect to a fiducial. An overlying component is placed within the inherent planar tolerance error (X) and rotational tolerance error (R) with respect to the bottom part, meaning that the tolerance error of the overlying part may be 2X from the intended position with a rotational misalignment as great as 2R. The placement challenges increase with the number of components on the substrate due to systemic offsets or overall statistical variability resulting in lower product manufacturing yields. Misalignment errors are further exacerbated when one or more parts on the same substrate are comprised of a fixed array of elements. The rotational tolerances translate into planar offsets that increase with the components distance to the rotational origin.

To reduce the problems arising from relying solely upon machine placement accuracies, the tight tolerance placement of parts incurs significant additional manufacturing costs since it typically must be performed on either highly accurate placement machines or on equipment that comprises active feedback loops such as computer automated vision systems or optical alignment testing. For example, a first optical component (e.g., a laser diode) must be positioned with respect to a communicating second optical component (e.g., a lens). Alignment between the components is tested by creating an optical signal. For example, a single chip or PCB is clamped into a test fixture. Upon energizing, a lid may be placed over the test fixture with an optical interface connected to a device that may, for example, measure light intensity. The relationship between components is adjusted until the test results are satisfactory, and the components can be fixed into permanent positions on the PCB. This process is often referred to as active alignment, as opposed to passive alignment where the components need not be energized or electrically tested in place. This combination of testing, aligning, and permanently fixing components is both slow and costly.

It would be advantageous if tight tolerance component stacks could be fabricated using robotic procedures, without the requirement of active alignment.

SUMMARY OF THE INVENTION

The placement of optical components, such as laser diodes (e.g., vertical-cavity surface-emitting laser (VCSELs)) and photodiodes, is critical for optimal optical performance. Conventional techniques include high-accuracy low throughput pick-and-place machines, machine vision, and alignment testing. Disclosed herein is a method able to use a precise mechanical alignment jig to reduce the accumulation of placement errors arising from placement machine and component dimensional tolerances.

Accordingly, a method is provided for assembling a stack of surface-mount devices (SMDs) on a substrate. The method provides a substrate, die, or printed circuit board (PCB) with a top surface having a landing pad and a first reference feature. An alignment jig is placed overlying the substrate top surface. The alignment jig has a second reference feature and a first boundary feature. For example, the first and second reference features may be fiducials, and the first boundary feature may be a side of the alignment jig having a vertical surface that is normal with respect to the PCB top surface. The alignment jig second reference feature is aligned with respect to the substrate first reference feature. A first SMD is placed overlying the substrate landing pad. The first SMD has a third reference feature. The first SMD third reference feature is aligned with respect to the alignment jig second reference feature. For example, the first SMD may be s laser diode.

A second SMD is placed overlying the substrate top surface. The second SMD has a second boundary feature and a first interface. The second SMD first interface may be, for example, a microlens surface intended to gather light generated by a laser diode first SMD. Then, the alignment jig first boundary feature is mated with the second SMD second boundary feature. In response to the mating, the second SMD first interface is aligned over an underlying SMD active element.

Additional details of the above-described fabrication method are provided below.

BRIEF DESCRIPTION OF THE DRAWINGS

FIGS. 3A through 3D depict steps in an alternative exemplary fabrication process using the method described in FIG. 1.

FIG. 7 is a plan view of a substrate landing pad with a center point and a boundary radius surrounding the center point, where the boundary radius is less than or equal to a sum of a maximum first tolerance error and a maximum second tolerance error.

FIG. 8 is a plan view of the tolerance associated with mating the alignment jig first boundary feature with the second SMD second boundary feature.

DETAILED DESCRIPTION

Figure 1:
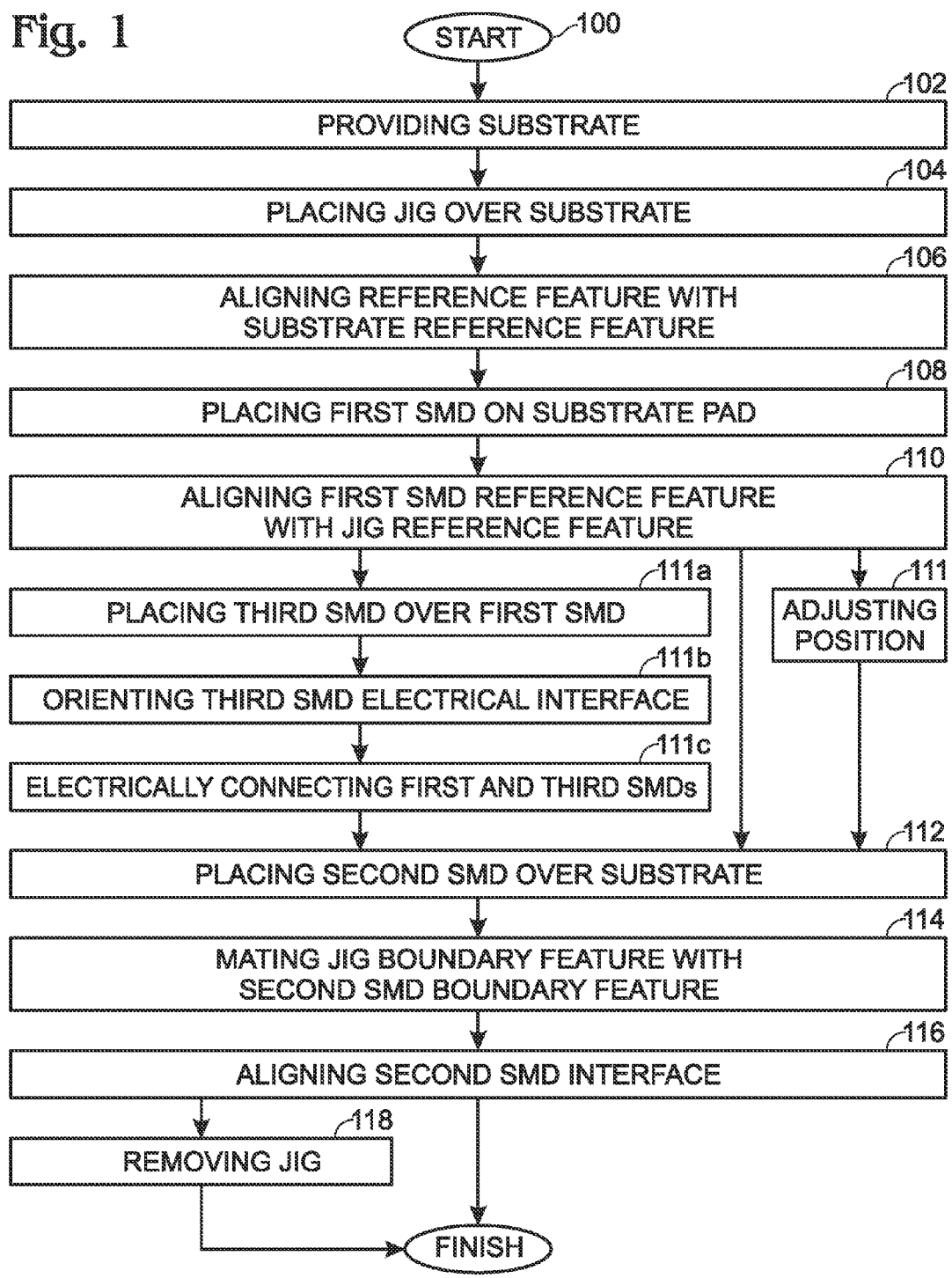
FIG. 1 is a flowchart illustrating a method for assembling a stack of surface-mount devices (SMDs) on a substrate.
Figure 2A:
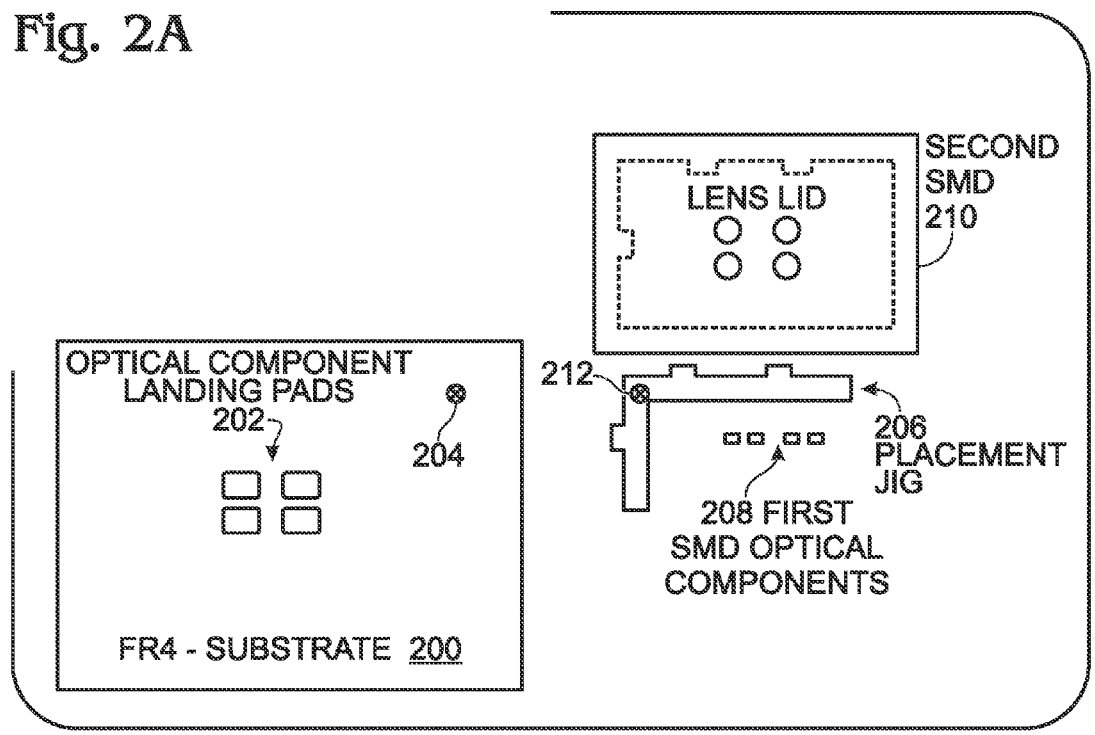
FIGS. 2A through 2H depict steps in an exemplary fabrication process using the method described in FIG. 1.

FIGS. 2A through 2H depict steps in an exemplary fabrication process using the method described in FIG. 1. FIG. 2A is a plan view depicting a substrate 200, for example a FR4 material, with 4 landing pads 202. The first reference feature 204 is a fiducial. To aid in placement, the component landing pads 202 may be substantially flat, with no traces running underneath the landing pads. The figure also shows the components to be placed: an alignment or placement jig 206, first SMD components 208 enabled as optical components, and a second SMD 210 enabled as a lens lid. To aid in placement, the alignment jig may be built using materials that can guarantee a tighter dimensional tolerance than the placement tolerance of the placement machine. Injection molded plastics, and stamped/formed metals are examples of materials that can be used in one aspect, the first reference feature (fiducial) 204 is used for coarse alignment of the jig 206 to the substrate 200, e.g., +/−1 mil (25 microns (um)). The reference feature (fiducial) 212 on the jig is used for the placement of the optical components 208.

Figure 2B:
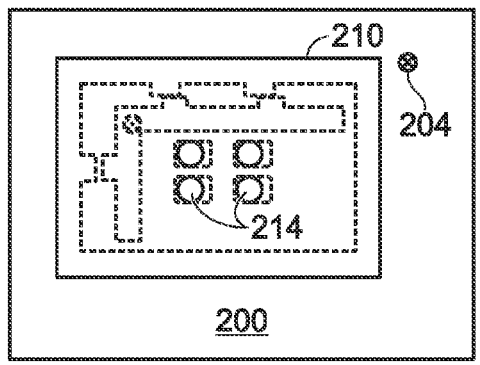

FIG. 2B depicts the final result, with the lens 214 in the second SMD lens cover 210 aligned over the landing pads (not shown) and optical components (not shown).

Figure 2C:
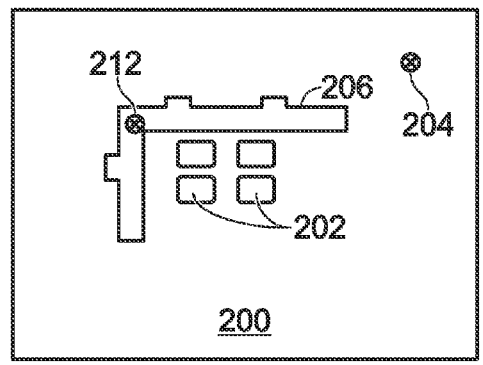
Figure 2D:
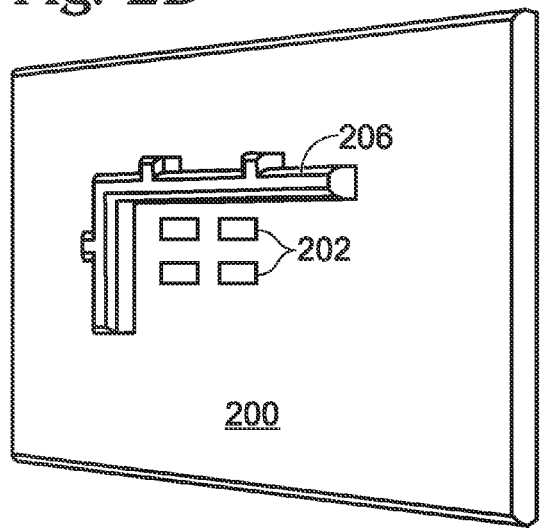

FIG. 2C is a plan view depicting a first step of placing the jig 206 onto substrate 200. FIG. 2D is a perspective view. The jig is placed on the substrate relative to the fiducial 204 on the substrate 200 using the second reference feature 212.

Figure 2E:
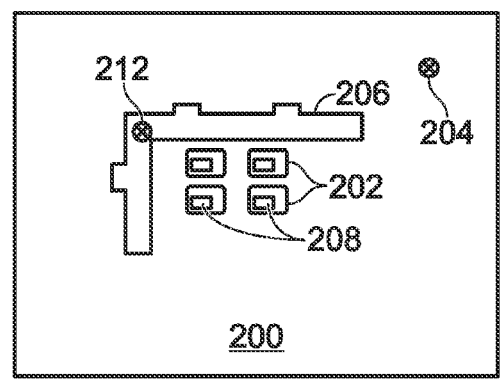
Figure 2F:
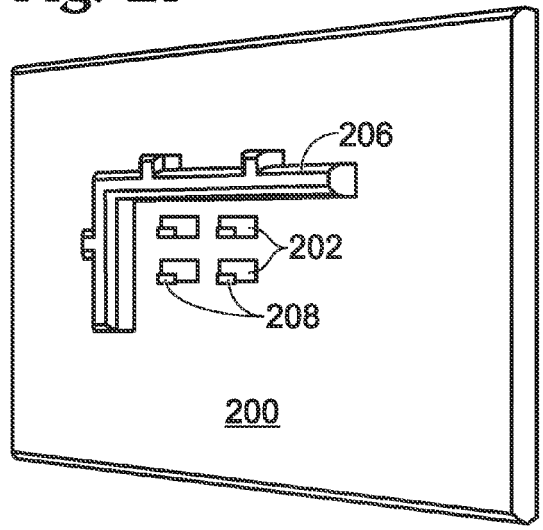

FIG. 2E is a plan view depicting first SMD component 208 placement relative to jig fiducial 212. FIG. 2F is a perspective view.

Figure 2G:
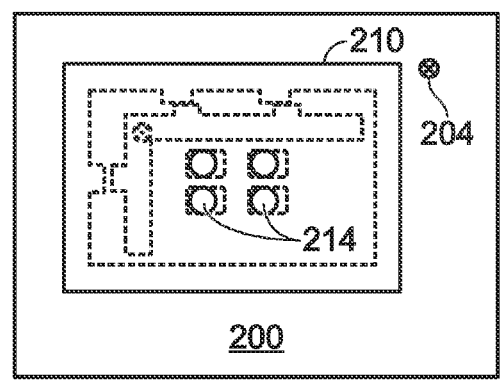
Figure 2H:
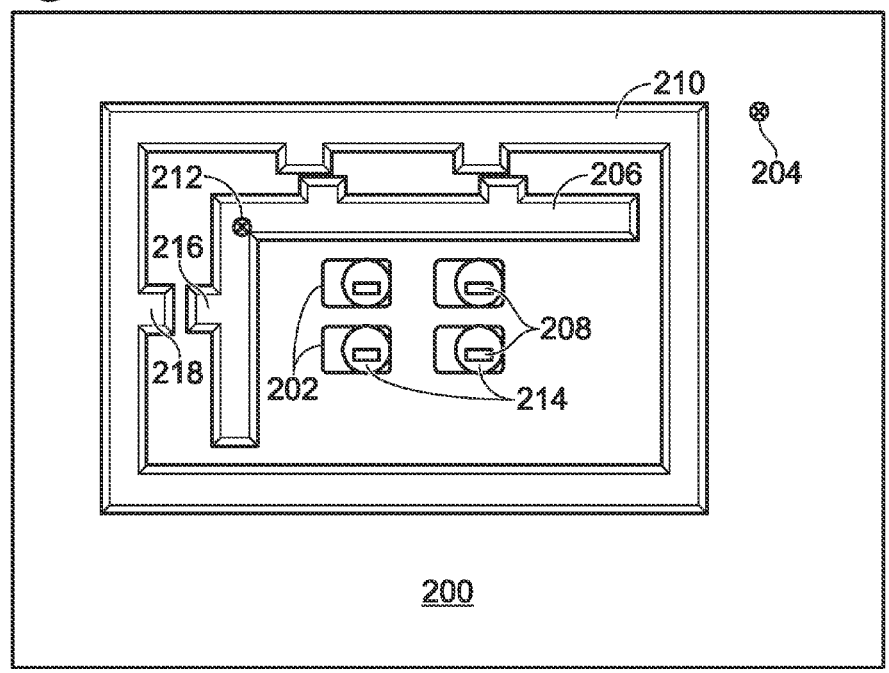

FIG. 2G is a plan view depicting the placement of the lens lid. The second SMD lens lid 210 is placed over the jig 206, so that jig aligns the previously placed optical components 208 to the lenses 214. The mating procedure is compatible with open-loop control loop mechanical processes and requires no active alignment mechanism such as optically enabling the optical components 208. FIG. 2H depicts the same view with the top of the second SMD lens lid transparent, so as to reveal the underlying parts. Note: in this embodiment the jig 206 has fingers 216 and second SMD has fingers 218 that aid in mating the second SMD 210 to the alignment jig 206.

Figure 3A:
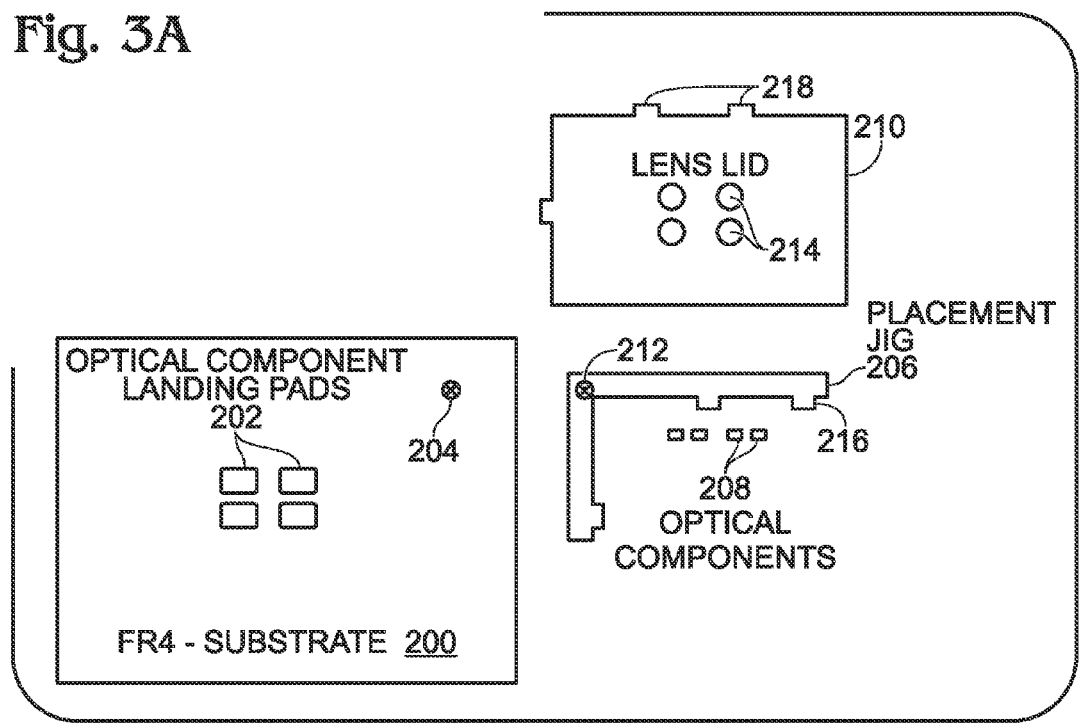

FIGS. 3A through 3D depict steps in an alternative exemplary fabrication process using the method described in FIG. 1. In this aspect the alignment jig 206 remains external to the second SMD lens lid 210 and can be removed, for instance to be re-used for component placements. FIG. 3A is a plan view of the various components and FIG. 3B is a plan view of the finished assembly. A substrate first reference feature 204 is used for coarse alignment of the jig 206 to the substrate 200 using second reference feature 212. The reference feature (fiducial) 212 on the jig is used for the placement of the optical components 208.

FIG. 3C is a plan view depicting the placement of the lens lid 210 next to the jig 206. The jig is used to align the previously placed optical components 208 with respect to the lenses 214. FIG. 3D depicts the same view as FIG. 3C with the lens lid transparent, so as to reveal the underlying parts. The mating procedure is compatible with open-loop control loop mechanical process and requires no active alignment mechanism. The jig 206 can be removed for re-use, discarded, or left in place.

FIG. 1 is a flowchart illustrating a method for assembling a stack of surface-mount devices (SMDs) on a substrate. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 100.

Step 102 provides a substrate with a top surface having a landing pad and a first reference feature. The substrate may alternatively be a circuit die or printed circuit board (PCB). Step 104 places an alignment jig overlying the substrate top surface. The alignment jig has a second reference feature and a first boundary feature. Step 106 aligns the alignment jig second reference feature with respect to the substrate first reference feature. Step 108 places a first SMD overlying the substrate landing pad. The first SMD has a third reference feature. Step 110 aligns the first SMD third reference feature with respect to the alignment jig second reference feature. Step 112 places a second SMD overlying the substrate top surface. The second SMD has a second boundary feature and a first interface. Step 114 mates the alignment jig first boundary feature with the second SMD second boundary feature. In response to the mating, Step 116 aligns the second SMD first interface over an underlying SMD active element. In some variations, subsequent to aligning the second SMD first interface over the underlying SMD active element in Step 116, Step 118 removes the alignment jig. In one aspect, subsequent to aligning the first SMD third reference feature with respect to the alignment jig second reference feature in Step 110, Step 111 adjusts the position of the first SMD by a predetermined value. More explicitly, the ultimate reference feature on a component may be an approximation of an absolute reference feature. This approximation may be derived for instance through statistical analysis of the fabrication process or empirically measured variations. For example, the optical interface for a photodiode may be difficult to observe during placement but the cut edges of the component may be more easily observed. The variations inn the distance and rotation between the optical interface and the edge of the photodiode can be averaged across a large sample size prior to assembly and a fixed translational and rotational offset can then be use relative to the cut edge as the approximate reference feature.

In one aspect (also see FIG. 6), Step 102 provides the substrate with a horizontal top surface and the alignment jig first boundary feature is a first side with a vertical surface. Likewise, the second SMD second boundary feature is a second side with a vertical surface. Their, mating the alignment jig first boundary feature with the second SMD second boundary feature in Step 114 includes butting the second side against the first side. Inn one variation, the alignment jig first side has a plurality of fingers with vertical surfaces, and the second SMD second side has a plurality of fingers with vertical surfaces. Then, butting the second side against the first side (Step 114) includes butting each of the alignment jig first side fingers against a corresponding finger of the second SMD second side (see FIG. 2H).

In another variation, the alignment jig has a first side with orthogonal horizontal portions, and the second SMD has a second side with orthogonal horizontal portions. Then, butting the second SMD second side against the alignment jig first side includes butting each portion of the second SMD second side against a corresponding portion of the alignment jig first side. For example, the alignment jig may be formed in an L-shape, and the second SMD may be L-shaped first side so that Step 116 butts each of the alignment jig first side fingers against a corresponding finger of the second SMD second side (see FIG. 2H). Note: depending upon the shape of the second SMD, the above-mentioned horizontal portions need not necessarily be orthogonal. For example, the jig may have a concave shape while the second SMD may have a mating convex shape. Other variations are also possible.

In another aspect, the alignment jig first side vertical surface (vertically) faces the landing pad. Then, butting the second side against the first side includes butting the second SMD second side adjacent to the alignment jig first side interior surface (see FIG. 3D). For example, when butting the second side of the second SMD against the alignment jig first side, the second SMD may overlie the first SMD (see FIG. 3B).

In one aspect, Step 102 provides a substrate with an exterior edge, and placing the alignment jig in Step 104 includes the alignment jig first side vertical surface being an exterior surface facing the substrate exterior edge. Then, butting the second side against the first side in Step 116 includes butting the second SMD second surface adjacent to the alignment jig first side exterior surface, in this variation, the alignment jig may be let in place and become part of the final assembly. For example, when the second side of the second SMD is butted against the alignment jig first side, the second SMD may overlie the first SMD (see FIG. 2H).

in one practical application of the method, the first SMD device may be a photodiode (PD) or a laser diode (i.e. a vertical-cavity surface-emitting laser (VCSEL)). The second SMD may be a lens assembly with a first interface lens. Then, aligning the second SMD first interface over the underlying SMD active element in Step 116 includes aligning the lens from the second SMD lens assembly over the PD or VCSEL (see FIG. 6).

In another practical application, the substrate has a plurality of landing pads, and in Step 104 each of a plurality of first SMDs is placed overlying a corresponding landing pad. Likewise, the second SMD has a plurality of first interfaces. Then, aligning in Step 116 includes aligning each second SMD first interface over a corresponding SMD active element (see FIG. 2H or 3D).

In one aspect, the substrate landing pad has a center point and a boundary surrounding the center point, where the boundary radius is twice a maximum first tolerance error. Aligning the alignment jig second reference feature with respect to the substrate first reference feature mark in Step 106 includes aligning within the first tolerance error. Aligning the first SMD third reference feature with respect to the alignment jig second reference feature in Step 110 includes aligning with a maximum error that is less than twice the maximum first tolerance error. That is, the third reference feature is within the boundary (see FIG. 7). Alternately stated, the maximum error (third tolerance) is a summation of the maximum first tolerance associated with a conventional pick-and-place error, and maximum second tolerance error associated with using the present invention jig.

In another aspect, mating the alignment jig first boundary feature with the second SMD second boundary feature in Step 114 includes mating with a maximum second tolerance error, where the second tolerance error is less than the first tolerance error. As a result, aligning the second SMD first interface over the underlying SMD active element in Step 116 includes aligning the second SMD first interface over the underlying SMD active element within a maximum third tolerance error, where the maximum third tolerance error is less than twice the maximum first tolerance error (see FIG. 8). That is, the use of a jig results in a smaller error than would be obtained by summing the errors of two component placements using a fiducial with a conventional pick-and-place optical location system. In one variation, prior to placing the second SMD overlying the substrate top surface in Step 112, Step 111a places a third SMD overlying the first SMD. Step 111b orients an electrical interface of the third SMD over an electrical interface of the first SMD. Step 111c electrically connects the electrical interface of the first SMD with the electrical interface of the third SMD. Then, aligning the second SMD first interface over the underlying SMD active element in Step 116 includes aligning the second SMD first interface over a third SMD active element (see FIG. 6). For example, the electrical interface of the third SMD may be oriented over the electrical interface of the first SMD by means of aligning a fourth reference feature of the third SMD with respect to the alignment jig second reference feature, or aligning the fourth reference feature of the third SMD with respect to the third reference feature of the first SMD. Alternatively, Steps 111a through 111c may orient and align optical interfaces of the first and third SMDs. That is, the optical interface may be used as the reference feature on one or more of the SMDs.

Aligning the optical interfaces is simply a case where both SMDs use the optical interface as the reference.

Figure 4:
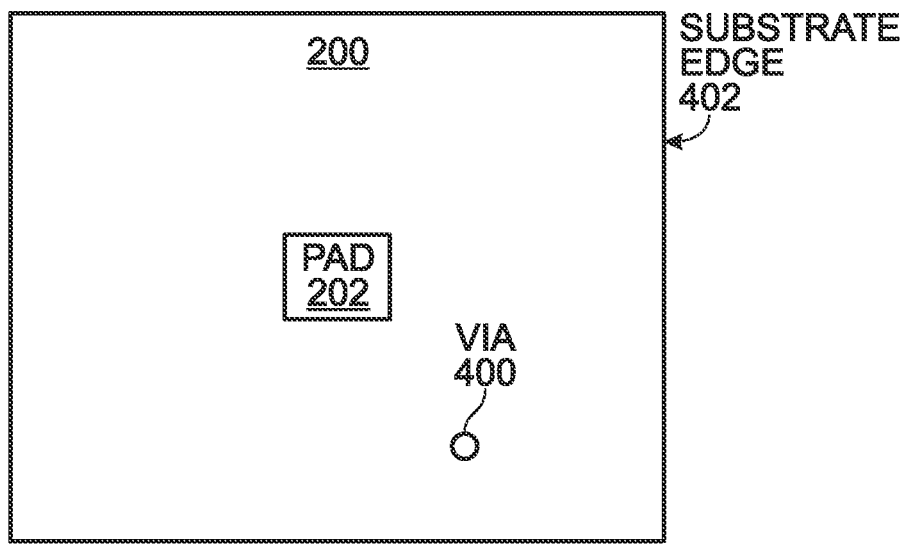
FIG. 4 is a plan view of a substrate with the first reference feature depicted alternatively as a substrate edge and as a hole in the substrate.

FIG. 4 is a plan view of a substrate with the first reference feature depicted alternatively as a substrate edge and as a hole in the substrate. Although a fiducial has been used as an example of a reference feature or mechanical reference, the reference feature can alternatively be a hole or via 400 in the substrate, or the edge of the substrate 402. In other aspects of the fabrication method the reference feature can be a single fiducial to ascertain x,y,rotation or multiple fiducials to ascertain rotational,x,y.

Figure 5:
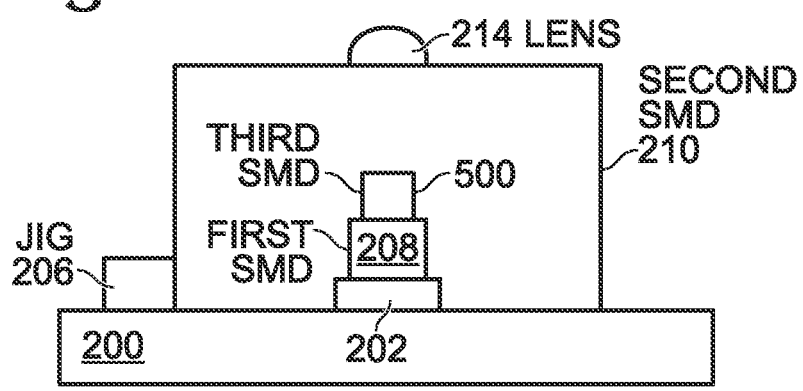
FIG. 5 is a partial cross-sectional view depicting a stack of three aligned SMDs.

FIG. 5 is a partial cross-sectional view depicting a stack of three aligned SMDs. In one variation, a third SMD 500 is interposed between the first 208 and second 210 SMDs. For example, an optical component may be fabricated in one technology (e.g., GaAs) and its associated amplifier may be fabricated in a different technology (e.g., bulk CMOS). In one aspect, the third SMD may be considered as a subcomponent of the second SMD. Either the first or second SMD may be an amalgam of multiple devices.

In another aspect, the landing area for the second SMD may be comprised of a landing space on the top of a previously placed SMD residing on the substrate. Instead of mounting the second SMD directly on the substrate, the third SMD is placed on the substrate relative to the jig reference, and then the second SMD is placed onto a region of the third SMD. The advantage to this method is that the bonds to electrically connect the second and third SMDs are now optimized for short distance, improving the signal integrity of this connection in fact, the accuracy of the second and third SMD placements may be such to allow flip-chip direct bonding as opposed to wirebonds. Consequently, any wirebonds from the third SMD to another component in the electrical chain may bear the brunt of the placement ambiguity and, hence, be longer than optimal. However, this connection may not be as critical to the performance of the circuit since the optical component is typically more sensitive to bond wire lengths, especially in the receive direction where the photodiode is typically a current mode device.

Practically, a second SMD lens lid can also be comprised of multiple elements, for instance discrete glass lenses on top of a transparent body. The preassembled variant can be treated as a single SMD.

When a third SMD is used, the placement of the uppermost (second) SMD in the sandwich can be done in either of 2 ways; relative to the boundary feature on the jig (as was done in the other configurations that lacked the presence of the third SMD), or using an alignment feature on top surface of the middle (third) SMD. The first approach has the advantage of ensuring the best alignment between the second SMD optical feature (e.g., the lens) since there is no accumulation of placement imprecision, but the disadvantage that the alignment between the upper (second) SMD and bottom (first) SMDs may be offset and require compensation (e.g., via wirebonds spanning the two SMDs). The second approach has the advantage of tighter placement of the layers of the sandwich (allowing for flipchip bonding which has inherent signal integrity benefits), but may result in an accumulation of offset error between the optical reference on the third SMD and the optical feature on the lens lid.

Figure 6:
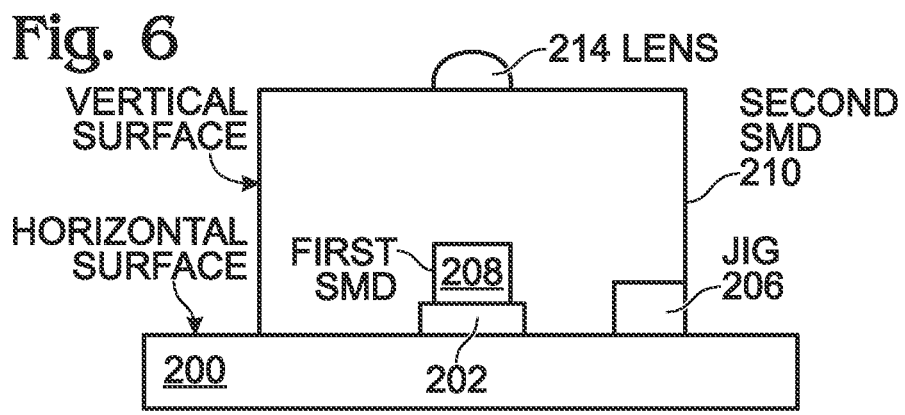
FIG. 6 is a partial cross-sectional view depicting a stack of two SMDs, where the first SMD has been passively aligned with the second SMD first interface lens.

FIG. 6 is a partial cross-sectional view depicting a stack of two SMDs, where the first SMD has been passively aligned with the second SMD first interface lens.

FIG. 7 is a plan view of a substrate landing pad 202 with a center point 700 and a boundary 702 surrounding the center point, where the boundary radius is twice the maximum first tolerance error. As described above, aligning the alignment jig second reference feature with respect to the substrate first reference feature mark in Step 106 of FIG. 1 includes aligning within the first tolerance error. This is a tolerance error is associated with conventional pick-and-place component placement. Aligning the first SMD third reference feature 704 with respect to the alignment jig second reference feature in Step 110 also includes aligning the third reference feature 704 within a tolerance error that is the summation of the maximum first tolerance and maximum second tolerance error, as described in greater detail in FIG. 8. This summation of tolerance errors, referred to as the maximum third tolerance error, is less than twice the maximum first tolerance error, which would be the tolerance associated with a conventional fiducial and a pick-and-place optical system. That is, the third reference feature is within the boundary 702.

FIG. 8 is a plan view of the tolerance associated with mating the alignment jig first boundary feature with the second SMD second boundary feature. As noted above in Step 114 of FIG. 1, the mating occurs with a maximum second tolerance error, as the error associated with butting the second SMD against the jig is less than the maximum first tolerance error associated with using a fiducial and pick-and-place optical location system. As a result, aligning the second SMD first interface over the underlying SMD active element in Step 116 includes aligning the second SMD first interface over the underlying SMD active element within a maximum third tolerance error. That is, the position of the third reference feature 704 on the first SMD is less than the maximum third tolerance error from second SMD first reference feature 800 (e.g., the center of lens 214). The maximum third tolerance error is the combination of the maximum first tolerance error (placing the jig 206 with respect to the first reference feature 204), and the maximum second tolerance error associated with aligning the second SMD boundary feature with respect to the jig boundary feature. Since the second tolerance error is a result of butting the second SMD against the jig, it is an inherently smaller error than the error associated with using a fiducial (the first tolerance error). Thus, the third tolerance error is less than twice the first tolerance error, where twice the first tolerance error would be the error resulting from the use of only fiducials to place the above-mentioned components.

A system and method have been provided for assembling a stack of SMDs. Examples of device structures and components have been presented to illustrate the invention. However, the invention is not limited to merely these examples. Other variations and embodiments of the invention will occur to those skilled in the art.

I claim:

1. A method for assembling a stack of surface-mount devices (SMDs) on a substrate, the method comprising:
   providing a substrate with a top surface having a landing pad and a first reference feature;
   placing an alignment jig overlying the substrate top surface, the alignment jig having a second reference feature and a first boundary feature;
   aligning the alignment jig second reference feature with respect to the substrate first reference feature;
   placing a first SMD overlying the substrate landing pad, the first SMD having a third reference feature;
   aligning the first SMD third reference feature with respect to the alignment jig second reference feature;
   placing a second SMD overlying the substrate top surface, the second SMD having a second boundary feature and a first interface;
   mating the alignment jig first boundary feature with the second SMD second boundary feature; and, in response to the mating, aligning the second SMD first interface over an underlying SMD active element.

2. The method of claim 1 wherein providing the substrate having the top surface includes providing the substrate with a horizontal top surface;
wherein placing the alignment jig having the first boundary feature includes the alignment jig first boundary feature being a first side with a vertical surface;
wherein placing the second SMD having the second boundary feature includes the second SMD second boundary feature being a second side with a vertical surface; and,
wherein mating the alignment jig first boundary feature with the second SMD second boundary feature includes butting the second side against the first side.

3. The method of claim 2 wherein placing the alignment jig includes the alignment jig first side having a plurality of fingers with vertical surfaces;
wherein placing the second SMD includes the second SMD second side having a plurality of fingers with vertical surfaces; and,
wherein butting the second side against the first side includes butting each of the alignment jig first side fingers against a corresponding finger of the second SMD second side.

4. The method of claim 2 wherein placing the alignment jig includes the alignment jig having a first side with orthogonal horizontal portions;
wherein placing the second SMD includes the second SMD having a second side with orthogonal horizontal portions; and,
wherein butting the second SMD second side against the alignment jig first side includes butting each portion of the second SMD second side against a corresponding portion of the alignment jig first side.

5. The method of claim 2 wherein placing the alignment jig includes the alignment jig first side vertical surface being an interior surface facing the landing pad; and,
wherein includes butting the second side against the first side includes butting the second SMD second side adjacent to the alignment jig first site interior surface.

6. The method of claim 5 wherein butting the second SMD second surface adjacent to the alignment jig first side interior includes butting the second side of the second SMD against the alignment jig first side, with the second SMD overlying the first SMD.

7. The method of claim 5 further comprising:
subsequent to aligning the second SMD first interface over the underlying SMD active element, removing the alignment jig.

8. The method of claim 2 wherein providing the substrate includes providing the substrate with an exterior edge;
wherein placing the alignment jig includes the alignment jig first side vertical surface being an exterior surface facing the substrate exterior edge; and,
wherein includes butting the second side against the first side includes butting the second SMD second surface adjacent to the alignment jig first side exterior surface.

9. The method of claim 8 wherein butting the second SMD second surface adjacent to the alignment jig first side exterior surface includes butting the second side of the second SMD against the alignment jig first side, with the second SMD overlying the first SMD.

10. The method of claim 1 wherein placing the first SMD includes placing the first SMD device with the active element selected from a group consisting of a photodiode and a laser diode;
wherein placing the second SMD includes placing the second SMD as a lens assembly with a first interface lens; and,
wherein aligning the second SMD first interface over the underlying SMD active element includes aligning the lens from the second SMD lens assembly over a first SMD active element.

11. The method of claim 1 wherein providing the substrate includes providing the substrate with a plurality of landing pads;
wherein placing the first SMD includes placing each of a plurality of first SMDs overlying a corresponding landing pad;
wherein placing the second SMD includes the second SMD having a plurality of first interfaces; and,
wherein aligning the second SMD first interface over the underlying SMD active element includes aligning each second SMD first interface over a corresponding SMD active element.

12. The method of claim 1 wherein providing the substrate includes providing the landing pad having a center point and a boundary surrounding the center point, where the boundary radius is twice a maximum first tolerance error;
wherein aligning the alignment jig second reference feature with respect to the substrate first reference feature mark includes aligning within the maximum first tolerance error; and,
wherein aligning the first SMD third reference feature with respect to the alignment jig second reference feature includes aligning the first SMD third reference feature with a maximum tolerance error less than twice the maximum first tolerance error, and inside the boundary.

13. The method of claim 12 wherein mating the alignment jig first boundary feature with the second SMD second boundary feature includes mating with a maximum second tolerance error, less than the maximum first tolerance error; and,
wherein aligning the second SMD first interface over the underlying SMD active element includes aligning the second SMD first interface over the underlying SMD active element within a maximum third tolerance error, where the maximum third tolerance error is a summation of the maximum first tolerance error and the maximum second tolerance error.

14. The method of claim 3 wherein placing the alignment jig includes the alignment jig having an L-shaped first side with orthogonal horizontal portions;
wherein placing the second SMD includes the second SMD having an L-shaped second side with orthogonal horizontal portions; and,
wherein butting the second SMD second side against the alignment jig first side includes butting each of the alignment jig first side fingers against a corresponding finger of the second SMD second side.

15. The method of claim 1 further comprising:
prior to placing the second SMD overlying the substrate top surface, placing a third SMD overlying the first SMD;
orienting an electrical interface of the third SMD over an electrical interface of the first SMD;
electrically connecting the electrical interface of the first SMD with the electrical interface of the third SMD; and,
wherein aligning the second SMD first interface over the underlying SMD active element includes aligning the second SMD first interface over a third SMD active element.

16. The method of claim 15 wherein orienting the electrical interface of the third SMD over the electrical interface of the first SMD includes an operation selected from a group consisting of aligning a fourth reference feature of the third SMD with respect to the alignment jig second reference feature, and aligning the fourth reference feature of the third SMD with respect to the third reference feature of the first SMD.

17. The method of claim 1 further comprising:
   aligning the first SMD third reference feature with respect to the alignment jig second reference feature, adjusting the position of the first SMD by a predetermined value.

\* \* \* \* \*